United States Patent
Thizon

(10) Patent No.: US 10,242,675 B2
(45) Date of Patent: *Mar. 26, 2019

(54) HUMAN-MACHINE DIALOGUE DEVICE

(71) Applicant: Schneider Electric Industries SAS, Rueil Malmaison (FR)

(72) Inventor: Patrice Thizon, Ruelle-sur-Touvre (FR)

(73) Assignee: SCHNEIDER ELECTRIC INDUSTRIES SAS, Rueil Malmaison (FR)

( * ) Notice: Subject to any disclaimer, the term of this patent is extended or adjusted under 35 U.S.C. 154(b) by 464 days.

This patent is subject to a terminal disclaimer.

(21) Appl. No.: 14/293,523

(22) Filed: Jun. 2, 2014

(65) Prior Publication Data

US 2014/0372124 A1    Dec. 18, 2014

(30) Foreign Application Priority Data

Jun. 13, 2013  (FR) ..................... 13 55471

(51) Int. Cl.
*G10L 21/00*   (2013.01)
*G10L 15/28*   (2013.01)
(Continued)

(52) U.S. Cl.
CPC ............ *G10L 15/28* (2013.01); *G06F 3/0202* (2013.01); *G06F 3/023* (2013.01); *G06F 3/038* (2013.01);
(Continued)

(58) Field of Classification Search
CPC ...................................... G10L 21/00
(Continued)

(56) References Cited

U.S. PATENT DOCUMENTS 5,848,152 A * 12/1998 Slipy ................... H04M 1/0216
                                                         379/433.13
6,140,593 A    10/2000 Bramesfeld et al.
(Continued)

FOREIGN PATENT DOCUMENTS

DE    198 39 811 A1    3/2000
DE    102 18 294 A1    11/2003
EP    2 479 646 A1    7/2012

OTHER PUBLICATIONS

French Preliminary Search Report dated Mar. 25, 2014 in French Application 13 55471, filed on Jun. 13, 2013 ( with English Translation of Categories of Cited Documents and Written Opinion).

*Primary Examiner* — Michael C Colucci
(74) *Attorney, Agent, or Firm* — Oblon, McClelland, Maier & Neustadt, L.L.P.

(57) ABSTRACT

The invention relates to a human-machine dialogue device (1), characterized in that it comprises:
  a housing comprising a docking station having:
    a universal human-machine dialogue assembly, each universal human-machine dialogue assembly comprising at least one display unit and at least one sensor device,
    a universal actuation device,
  the docking station being arranged to receive, without distinction, removably and interchangeably:
    a first modular unit (2c) having a display interface,
    a second modular unit (2a) having a pushbutton-type control interface,
    a third modular unit (2b) having a rotary button-type control interface.

21 Claims, 9 Drawing Sheets

(51) Int. Cl.
*G06F 3/02* (2006.01)
*G06F 3/023* (2006.01)
*G06F 3/038* (2013.01)
*H01H 19/02* (2006.01)
*G06F 3/0362* (2013.01)
*H03K 17/97* (2006.01)
*H01H 25/06* (2006.01)

(52) U.S. Cl.
CPC ........... *G06F 3/0362* (2013.01); *H01H 19/02* (2013.01); *H03K 17/97* (2013.01); *H01H 25/06* (2013.01); *H01H 2219/039* (2013.01); *H01H 2221/04* (2013.01); *H03K 2217/94068* (2013.01)

(58) Field of Classification Search
USPC ............. 704/270, 9; 455/347, 557, 566
See application file for complete search history.

(56) References Cited

U.S. PATENT DOCUMENTS

| | | | | |
|---|---|---|---|---|
| 6,163,090 | A * | 12/2000 | Brown | F16C 29/04 310/12.02 |
| 7,697,550 | B2 * | 4/2010 | Rada | H04L 47/14 370/401 |
| 7,876,288 | B1 * | 1/2011 | Huang | G06F 1/1616 345/178 |
| 7,906,873 | B1 * | 3/2011 | Roosli | H05B 37/0254 307/112 |
| 8,062,069 | B2 * | 11/2011 | Coester | H01R 13/7032 439/188 |
| 8,068,641 | B1 * | 11/2011 | Hildreth | A63F 13/04 250/203.1 |
| 2004/0263312 | A1 * | 12/2004 | Johnson | H01C 10/10 338/12 |
| 2005/0269196 | A1 | 12/2005 | Brown et al. | |
| 2006/0025176 | A1 * | 2/2006 | Llamas | G06F 1/1626 455/557 |
| 2006/0028236 | A1 | 2/2006 | Brown et al. | |
| 2006/0063466 | A1 * | 3/2006 | Conarro | A63H 5/00 446/26 |
| 2007/0016360 | A1 * | 1/2007 | Lee | G01C 21/3664 701/532 |
| 2008/0030291 | A1 * | 2/2008 | Keller | H01F 7/122 335/296 |
| 2008/0068117 | A1 | 3/2008 | Boss | |
| 2008/0100572 | A1 * | 5/2008 | Boillot | G06F 1/1632 345/158 |
| 2009/0184839 | A1 | 7/2009 | Brown et al. | |
| 2009/0195405 | A1 | 8/2009 | Brown et al. | |
| 2009/0195406 | A1 | 8/2009 | Brown et al. | |
| 2009/0235713 | A1 * | 9/2009 | Toeniskoetter | B21D 39/021 72/220 |
| 2010/0093401 | A1 * | 4/2010 | Moran | G06F 1/1626 455/566 |
| 2011/0292618 | A1 * | 12/2011 | Naukkarinen | G06F 1/1632 361/729 |
| 2012/0191458 | A1 | 7/2012 | Benni et al. | |
| 2012/0289291 | A1 * | 11/2012 | Moran | H04M 1/0256 455/566 |
| 2013/0206729 | A1 * | 8/2013 | Lang | H01H 9/341 218/148 |
| 2014/0266669 | A1 * | 9/2014 | Fadell | G05B 19/042 340/501 |
| 2014/0315510 | A1 * | 10/2014 | Heng | H01H 19/14 455/347 |

\* cited by examiner

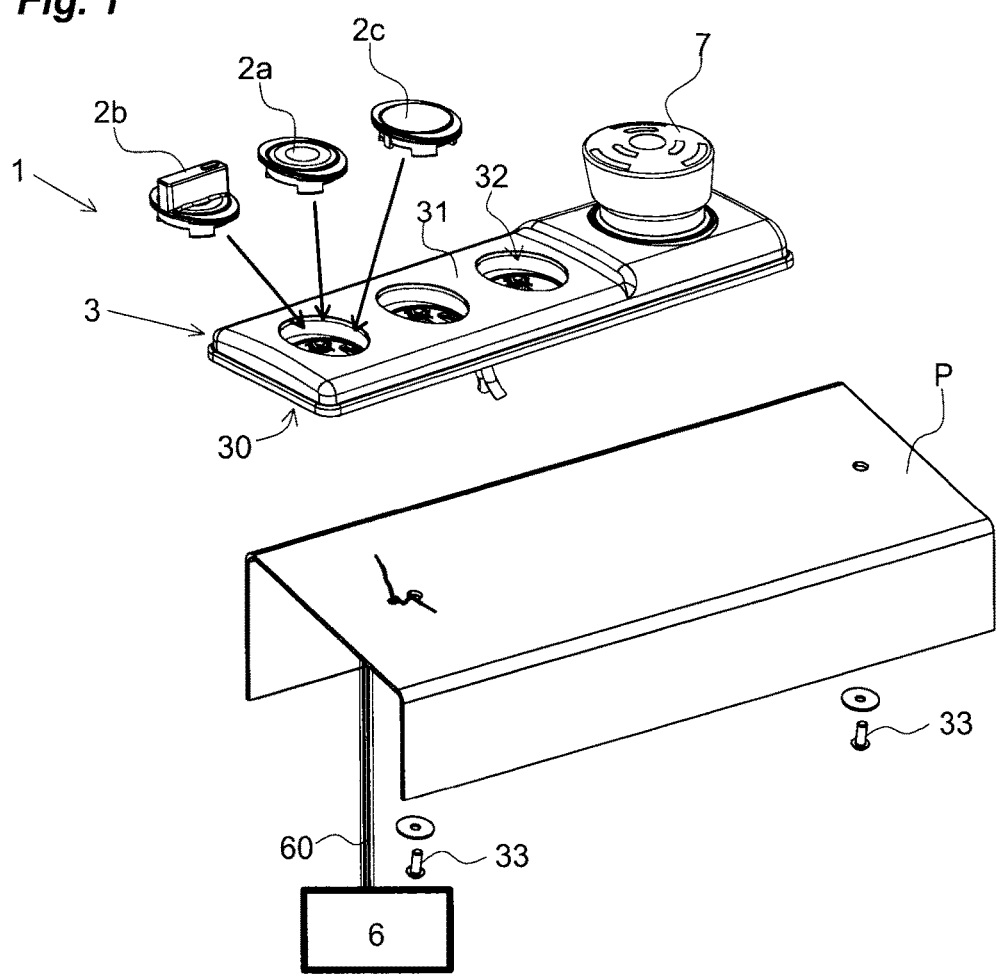

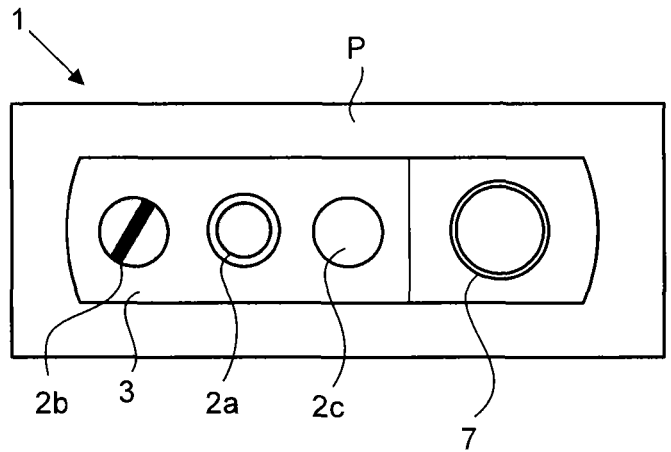
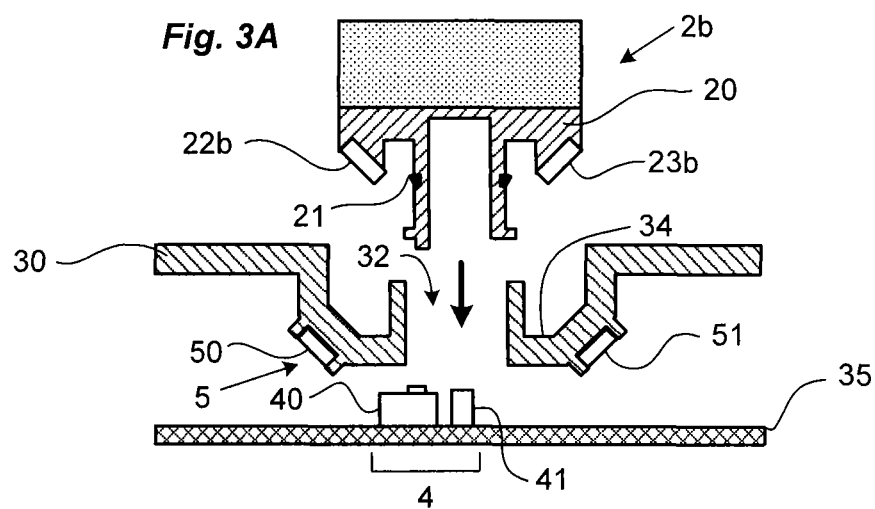
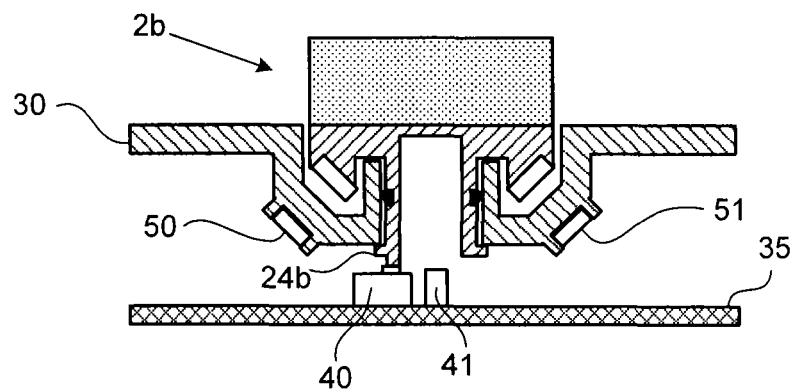

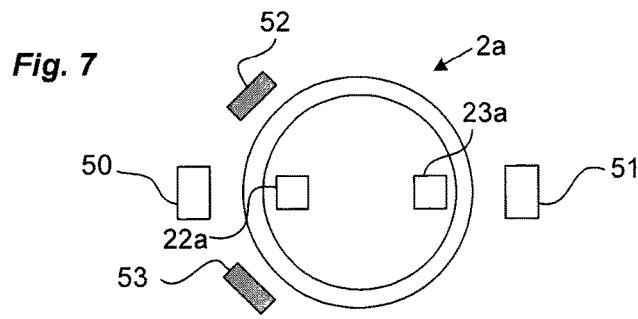
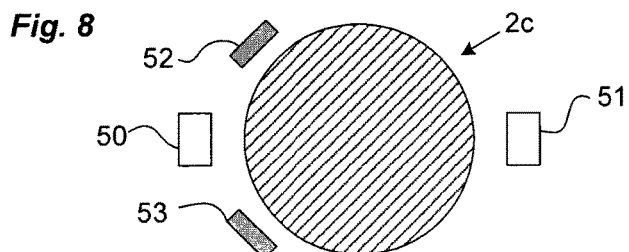
3 fixed positions
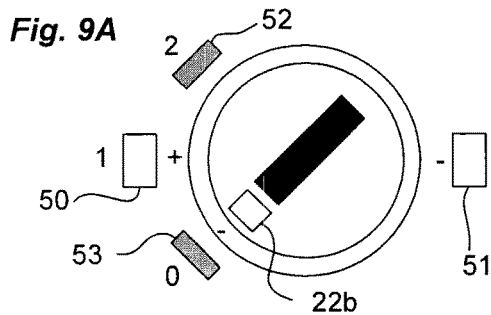
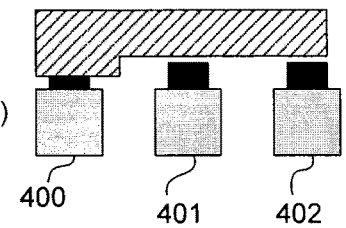
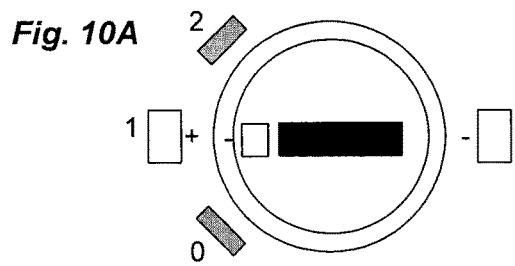
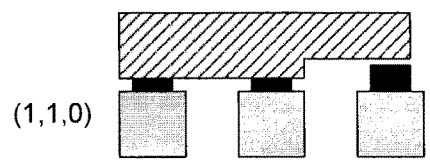
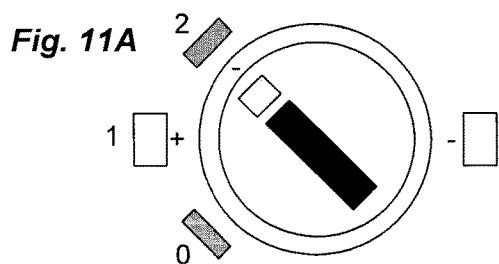
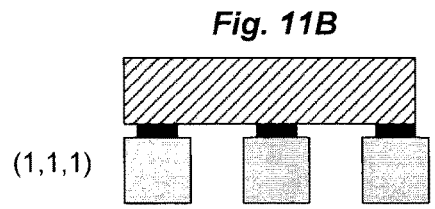

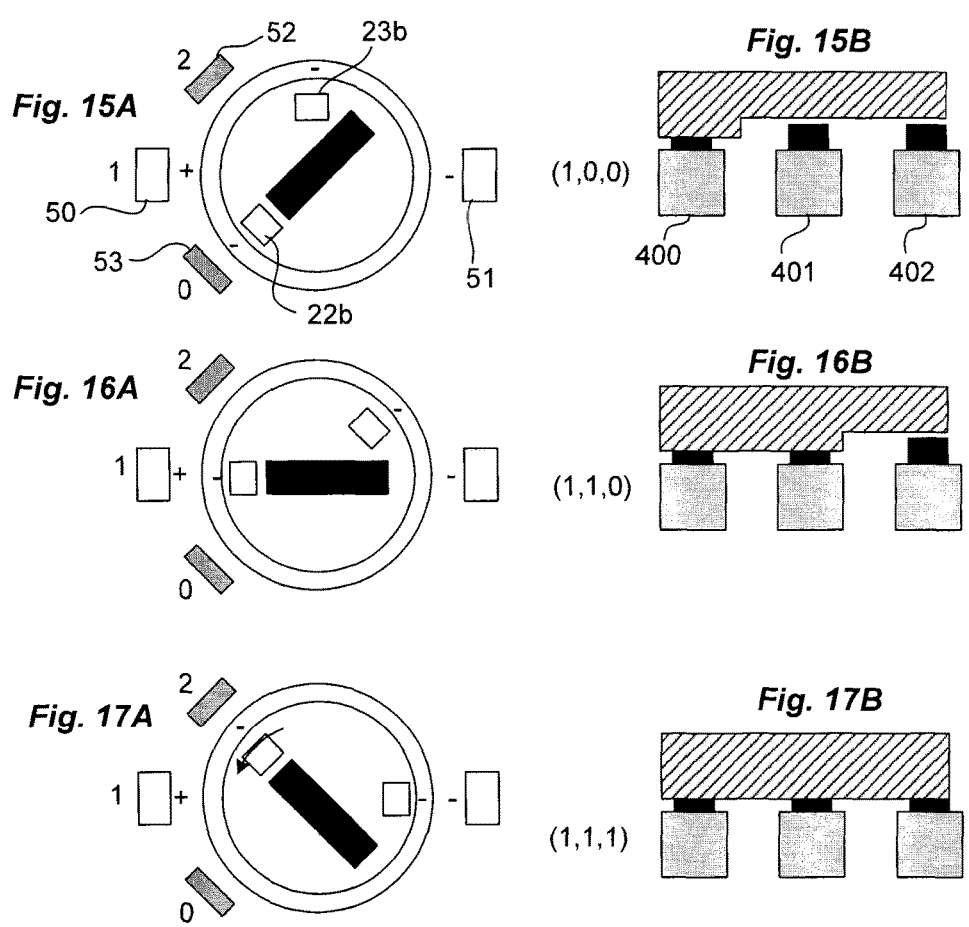

2 fixed positions and 1 return (1,0,0)

(1,1,0)

(1,1,1)

1 fixed position and 1 return (1,0,0)

(1,1,1)

(0,0,0)

(0,0,0)

(0,0,0)

(1,0,0)

(1,1,0)

(1,0,1)

(1,0,0)

(1,1,0)

(1,0,1)

HUMAN-MACHINE DIALOGUE DEVICE

TECHNICAL FIELD OF THE INVENTION

The present invention relates to a human-machine dialogue device. The invention relates more particularly to a modular human-machine dialogue device with an architecture that can be easily adapted to the application being controlled. The invention relates also to a human-machine dialogue system incorporating at least one human-machine dialogue device of the invention.

STATE OF THE ART

To control an application, it is known practice to employ different types of human-machine dialogue devices. These can have a control interface of pushbutton type, of rotary button type and/or have a display interface.

The way these devices operate differ and their architectures also differ.

The patent applications DE19839811A1, DE10218294A1, US2008/068117A1, US2005/269196A1, EP2479646A1 describe human-machine dialogue systems.

The aim of the invention is to propose a human-machine dialogue device having a modular design, enabling an operator to easily choose the function of his or her device and modify it if necessary, without profoundly affecting its architecture and without having to completely dismantle it.

EXPLANATION OF THE INVENTION

This aim is achieved by a human-machine dialogue device comprising:
- a housing comprising a docking station having:
  - a universal human-machine dialogue assembly, each universal human-machine dialogue assembly comprising at least one display unit and at least one sensor device,
  - a universal actuation device,
  - the docking station being arranged to receive, without distinction, removably and interchangeably:
    - a first modular unit having a display interface arranged to cooperate with the display unit of the universal human-machine dialogue assembly so as to send coloured display information generated by the display unit, or
    - a second modular unit having a pushbutton-type control interface arranged to cooperate with said sensor device in order to generate at least one control signal and an actuation system arranged to cooperate with the universal actuation device in order to confer a rest position and an actuated position on the control interface, or
    - a third modular unit having a rotary button-type control interface arranged to cooperate with said sensor device in order to generate at least one control signal and comprising an actuation system arranged to cooperate with the universal actuation device in order to confer a plurality of fixed and/or transient positions on the control interface.

According to a particular feature, the universal actuation device comprises a first permanent magnet and a second permanent magnet and two metal plates located on either side of the first permanent magnet.

According to another particular feature, the actuation system of the second modular unit with pushbutton-type control interface comprises two permanent magnets, arranged to each cooperate with the first permanent magnet and the second permanent magnet of the universal actuation device.

According to another particular feature, the actuation system of the third modular unit with rotary button-type control interface comprises at least one first permanent magnet arranged to cooperate by magnetic effect with the first permanent magnet or with the two metal plates to mark fixed or transient distinct angular positions.

According to another particular feature, the actuation system of the third modular unit with rotary button-type control interface comprises a second permanent magnet arranged to cooperate by magnetic effect with the second permanent magnet to confer a rotational return function on the control interface.

According to another particular feature, the second modular unit or the third modular unit also comprises a display interface arranged to cooperate with the display unit of the docking station.

According to another particular feature, the display interface comprises a coloured transparent or translucent plate cooperating with the display unit to return said coloured display information.

According to another particular feature, each sensor device comprises at least three sensor units mounted in a circular arc on an electronic board so as to detect three distinct angular positions.

According to another particular feature, each sensor unit comprises a mechanically actuated switch.

According to another particular feature, the control interface of rotary button type and of pushbutton type comprises at least one actuation tab arranged to cooperate with each mechanically actuated switch to confer a state on its modular unit.

According to another particular feature, the actuation tab is arranged to cooperate with one or more of said three sensor units in order to code the control interface and display interface type.

According to another particular feature, the first modular unit with display interface comprises an actuation tab arranged to cooperate with one or more of said three sensor units in order to code said coloured display information said modular unit.

According to another particular feature, the housing comprises fastening means on a wall and these fastening means comprise two orifices intended to each receive a fastening screw.

The invention relates to a human-machine dialogue system comprising at least one human-machine dialogue device as defined above, a central control unit and a cable linking said central control unit to the universal human-machine dialogue assembly, said central control unit being arranged to power each universal human-machine dialogue assembly and exchange signals with the universal human-machine dialogue assembly.

According to a particular feature, the central control unit comprises a learning software module arranged to execute a learning step making it possible to determine the modular unit type positioned on the docking station.

According to another particular feature, the learning software module is arranged to determine the type of the control and/or display interface of the human-machine dialogue device as a function of one or more states assumed by the sensor device in the learning step.

According to another particular feature, the universal human-machine dialogue devices are connected to the central control unit by a multipoint link by employing a communication and power supply bus.

According to another particular feature, the universal human-machine dialogue devices are connected to the central unit by a point-to-point link.

According to another particular feature, each modular unit comprises an electronic tag storing its control and/or display interface type.

According to another particular feature, the system comprises a station for reading electronic tags incorporated in each modular unit, said reading station comprising an antenna arranged inside the housing.

According to another particular feature, the system comprises a wireless communication module arranged to exchange data with the central control unit via a wireless link.

According to another particular feature, the system comprises a plurality of identical docking stations arranged contiguously inside the housing.

BRIEF DESCRIPTION OF THE FIGURES

Other features and advantages emerge from the following detailed description, given in light of the appended drawings in which:

FIG. 1 represents, in a perspective view, an exemplary embodiment of a human-machine dialogue system comprising a plurality of human-machine dialogue devices according to the invention, FIG. 2 represents, in a plan view, an exemplary embodiment of the human-machine dialogue system of FIG. 1, FIGS. 3A and 3B represent, in a cross-sectional view, a human-machine dialogue device with rotary button-type control interface, respectively before and after snap-fitting in its housing.

DETAILED DESCRIPTION OF AT LEAST ONE EMBODIMENT

Figure 4:
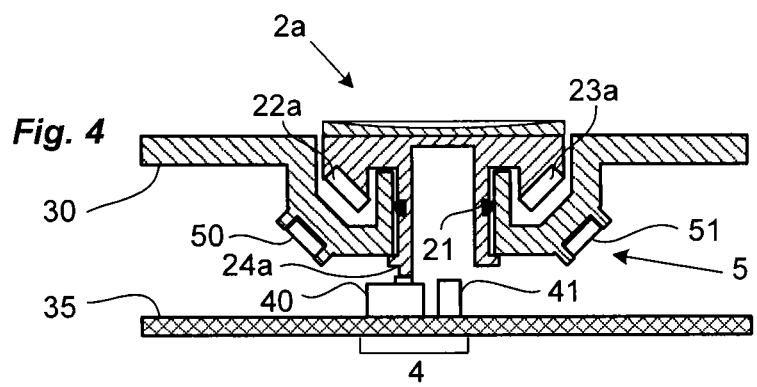
FIG. 4 represents, in a cross-sectional view, a human-machine dialogue device with pushbutton-type control interface.

As is known, a human-machine dialogue device comprises mainly:
    a functional unit providing a switching and/or display function,
    a human-machine dialogue interface comprising a control interface on which a user acts to perform the switching function and/or a display interface returning display information produced by the functional display unit.

"Functional unit with switching function" should be understood to mean the elements which make it possible to fulfill the function of the human-machine dialogue device. That includes any sensor unit, for example mechanically or magnetically actuated, with capacitive, inductive, optical or resistive effect. "Functional unit with display function" should be understood to mean any display unit, such as, for example, a light-emitting diode or an RGB (Red Green Blue) system. The light-emitting diode will be able to be coloured or white, the colour of the human-machine dialogue unit then being produced by the human-machine dialogue interface. The RGB system is controlled in colour and intensity by an electronic control unit.

"Control interface" should be understood to mean, for example, an actuation button of pushbutton or rotary button type with at least two positions and "display interface" should be understood to mean, for example, a cap or a plate, transparent or translucent, coloured or not.

Obviously, some human-machine dialogue devices comprise both a control interface and a display interface. Such is, for example, the case of illuminated pushbuttons.

Moreover, a human-machine dialogue device with control interface should also comprise an actuation assembly responsible for marking the fixed or transient positions of the control interface. It may be a mechanically and/or magnetically operated actuation assembly. If the control interface is a rotary button, this actuation assembly makes it possible to define the different angular positions, fixed or transient, of the button. If the control interface is a pushbutton, the actuation assembly makes it possible to return the pushbutton to the rest position after it is pressed.

The invention consists in particular in dissociating the functional unit from its human-machine dialogue interface by proposing a solution allowing a user to configure his or her device by choosing the human-machine dialogue interface that he or she wants to use without having to touch the functional unit. By employing a universal human-machine dialogue assembly producing all the functions of the functional unit (primarily switching and display functions), the user can thus adapt a human-machine dialogue interface thereto, comprising a control interface and/or a display interface. The device of the invention is explained in detail below.

FIG. 1 represents a human-machine dialogue system comprising a plurality of human-machine dialogue devices of the invention, positioned adjacently and sharing one and the same housing 3. Hereinafter in the description, the human-machine dialogue device of the invention will be described in the context of the system represented in FIG. 1.

With reference to FIG. 1, the system 1 thus comprises a housing 3, for example made of plastic material, comprising a base 30 intended to be fastened, by its bottom face, onto a wall P, for example the wall of an electrical enclosure or of a control console, and a cover 31 added to said base 30. Said base 30 comprises, for example, fastening means so as to be fastened onto said wall P. Said fastening means comprise, for example, two orifices (not visible in the figures) passing through the base 30 and each intended to receive the end of a screw 33 passing through the wall P and the base 30.

Said cover 31 comprises, through its top face, one or more openings 32 of identical size emerging inside the housing 3. These openings 32 are preferentially circular and thus each correspond to a docking station making it possible to accommodate a modular unit described hereinbelow. At the periphery of each opening 32, the cover 31 comprises an annular dish 34 (see FIG. 3A). Each opening 32 is formed in such a way as to form a tubular part forming a translational or rotational guide for a control interface.

All the docking stations are identical so as to be able to accommodate, without distinction, different types of modular units without any modification.

Each docking station, embodied by an opening 32 produced through the cover 31, has:
a universal human-machine dialogue assembly 4,
a universal actuation device 5.

The universal human-machine dialogue assembly 4 is able to produce the switching function and the display function that are described above. More specifically, each universal human-machine dialogue assembly 4 therefore comprises at least one sensor device 40 responsible for producing the switching function and one display unit 41 responsible for producing the display function. On each docking station, all the functions are therefore produced in a way as to enable a user to be able to add thereto the human-machine dialogue interface of his or her choice.

In the system as represented in FIG. 1, the universal human-machine dialogue assemblies 4 are, for example, welded onto one and the same electronic board 35 housed inside the housing 3, a distinct universal human-machine dialogue assembly 4 being positioned under each opening of the cover. In the appended figures, a single electronic board 35 is employed and the latter extends inside the housing.

More specifically, a display unit 41 employed in a universal human-machine dialogue assembly 4 comprises, for example, a light-emitting diode or an RGB (Red Green Blue) system. The light-emitting diode will be able to be coloured or white, the display interface being transparent, translucent or coloured. The RGB system will, for example, be controlled in colour and intensity by an electronic control unit.

Figure 6:
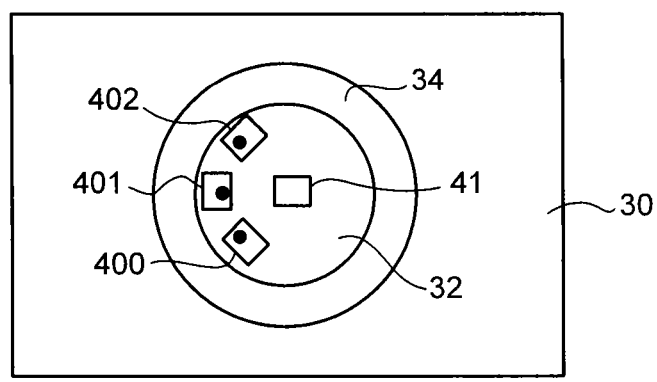
FIG. 6 represents, in a plan view, a docking station of the device of the invention, FIG. 7 schematically illustrates the operating principle of a human-machine dialogue device with pushbutton-type control interface, FIG. 8 schematically illustrates the operating principle of a human-machine dialogue device with display interface, FIGS. 9A to 11B schematically illustrate the operating principle of a human-machine dialogue device with control interface of rotary button type with three fixed positions, FIGS. 12A to 14B schematically illustrate the operating principle of a human-machine dialogue device with control interface of rotary button type with two fixed positions, FIGS. 15A to 17B schematically illustrate the operating principle of a human-machine dialogue device with control interface of rotary button type with two fixed positions and one return position, FIGS. 18A to 20B schematically illustrate the operating principle of a human-machine dialogue device with control interface of rotary button type with two fixed positions and one return position, FIGS. 21A to 23B schematically illustrate the operating principle of a human-machine dialogue device with control interface of rotary button type with one fixed position and one return position.

Each sensor device 40 employed in a universal human-machine dialogue assembly 4 comprises, for example, three sensor units 400, 401, 402 positioned according to three distinct angular positions (FIG. 6). The three sensor units will be able to be magnetically actuated microswitches of "MEMS" or "reed" type, or mechanically actuated microswitches. In the appended figures, the three sensor units 400, 401, 402 are mechanically actuated microswitches. They can be actuated directly by the control interface or by the display interface.

If the control interface is of rotary button type, with three fixed or transient positions, the first position is detected by the change of state of a single sensor unit, the second position is detected by the change of state of two sensor units simultaneously and the third position is detected by the change of state of the three sensor units simultaneously.

If the control interface is of pushbutton type, the rest position is detected by the deactivated state (0,0,0) of the three sensor units 400, 401, 402 simultaneously and the working position (depressed) is detected by the change of state of at least one of the three sensor units.

Each docking station also has an identical universal actuation device 5 that can be adapted to a modular unit having a control interface of rotary button type or a modular unit having a control interface of pushbutton type. If a docking station receives a modular unit provided only with a display interface, the universal actuation device associated with this docking station will not be employed.

At each docking station, the universal actuation device is arranged to cooperate with an actuation system present in the modular unit with control interface, thus conferring on the modular unit its actuation type. It therefore makes it possible to be adapted to all types of control interface, by making it possible to ensure the selection function for a control interface of rotary button type, and the return function for a control interface of pushbutton type.

The universal actuation device is preferentially of magnetic type, so as to allow total independency in relation to the modular unit. With reference to the appended figures, it comprises, for example, two permanent magnets 50, 51, designated first magnet and second magnet, situated diametrically opposite in relation to the opening and two metal plates 52, 53 situated on either side of the first permanent magnet 50. The two permanent magnets 50, 51 and the metal plates 52, 53 are preferentially situated in recesses produced in the cover, on the internal surface formed by the dish 34. The two metal plates 52, 53 and the first magnet 50 are arranged to define three distinct angular positions.

The operating principle of the universal actuation device will be explained hereinbelow.

According to the invention, the system 1 of FIG. 1 thus comprises a plurality of modular units 2a, 2b, 2c (generally designated 2). A modular unit 2 of the invention comprises neither electronic board, nor functional switching or display unit. It is independent in relation to its functional unit. A modular unit with control interface for its part, comprises an actuation system arranged to cooperate with a universal actuation device as described above.

According to the invention, each modular unit 2 occupies a docking station by being housed in an opening 32 produced through the cover 31.

All the modular units 2, with control interface and/or with display interface, have a common architecture. Each modular unit thus comprises a body 20, for example made of plastic material, arranged to be pressed into an opening 32 of the cover and a head bearing the control interface and/or the display interface. The body 20 has a tubular tail, said tail being provided with a groove on its lateral surface in which a lip seal 21 is housed, intended to ensure the ingress protection by being pressed against the internal edge of the opening 32. The body 20 also comprises an external collar intended to be housed in the dish 34 produced at the periphery of the opening 32. Depending on its function, the modular unit 2 comprises one or two magnets housed in its collar.

According to the invention, each modular unit is fastened through an opening 32 produced in the cover. The fastening is, for example, done by snap-fitting of the body 20 of the modular unit 2 to the depth of the housing level with the opening 32 of the docking station. Other securing means can of course be employed.

With reference to FIGS. 4 and 7, a modular unit 2a provided with a control interface of pushbutton type comprises two permanent magnets 22a, 23a, positioned so as to be diametrically opposite to be placed facing the two magnets of the universal actuation device. Each of the two magnets is oriented in such a way as to generate a magnetic repulsion effect with the magnet which faces it. The return of the pushbutton from the working position to the rest position is therefore ensured by the magnetic repulsion effect generated between the magnets 22a, 23a of the actuation system and the magnets 50, 51 of the universal actuation device. The control interface of pushbutton type more particularly comprises a bearing top surface, optionally transparent or translucent, coloured or not, so as to allow the light emitted by the display unit to pass through it. In the extension of its tubular tail, it also comprises one or more actuation tabs 24a, arranged to act on one or more of the sensor units 400, 401, 402 of the universal human-machine dialogue assembly 4.

Figure 5:
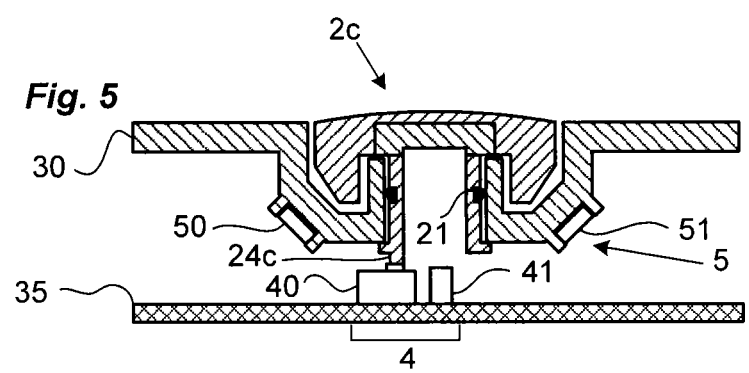
FIG. 5 represents, in a cross-sectional view, a human-machine dialogue device with display interface.

With reference to FIGS. 5 and 8, a modular unit 2c provided with a display interface more particularly comprises a top surface that is transparent or translucent, coloured or not, so as to allow the light emitted by the display unit 41 of the universal human-machine dialogue device 4 to pass through it. This modular unit 2c has only the indicator light function and therefore does not comprise any actuation system in the sense described above. The universal actuation device of the corresponding docking station will be present but not employed. Advantageously, the modular unit 2c nevertheless comprises an actuation tab 24c, the function of which will be described hereinbelow.

With reference to FIGS. 3A and 3B, a modular unit 2b provided with a control interface of rotary button type more particularly comprises a gripping lug enabling it to be grasped by hand. This gripping lug will be, for example, made of opaque material, or of transparent or translucent material, coloured or not, so as to allow the light emitted by the display unit 41 to pass through it. In the extension of its tubular tail, it also comprises one or more actuation tabs 24b arranged to mechanically actuate one, two or three sensor units of the universal human-machine dialogue device 4 depending on the selected angular position. It also comprises its actuation system intended to cooperate with the universal actuation device of its docking station. Depending on its control interface, with two fixed positions, three fixed positions, one fixed position and one transient position or two fixed positions and one transient position, it comprises one or two permanent magnets responsible for cooperating with the universal actuation device present in its docking station.

With reference to FIGS. 9A to 11B, a modular unit 2b provided with a control interface of rotary button type with three fixed positions thus comprises a single magnet 22b enabling the selector to be positioned in the three positions defined by the first permanent magnet 50 and the two metal plates 52, 53 of the universal actuation device 5. Its magnet 22b is arranged to face the first magnet 50 of the universal actuation device 5 with a reversed polarity so as to be able to mark the position. In FIGS. 9A and 9B, the rotary button is in the first position (designated 0). A single sensor unit 400 is activated (state (1,0,0)). In FIGS. 10A and 10B, the rotary button is in the second position (designated 1). Two sensor units 400, 401 are activated (state (1,1,0)). In FIGS. 11A and 11B, the rotary button is in the third position (designated 2). The three sensor units 400, 401, 402 are activated (state (1,1,1)).

Figure 12A:
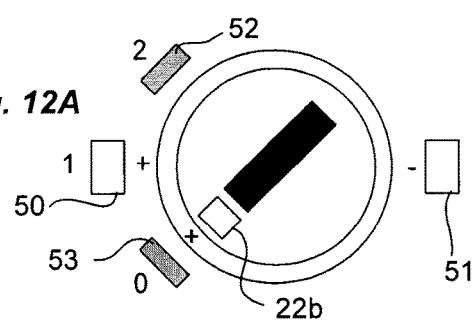
Figure 12B:
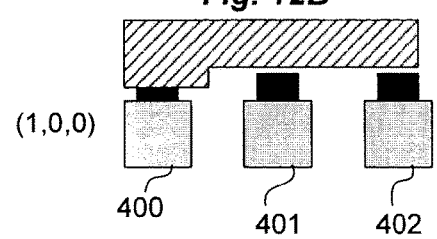
Figure 13A:
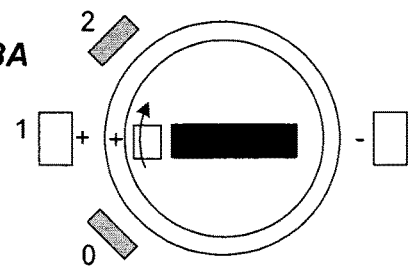
Figure 14A:
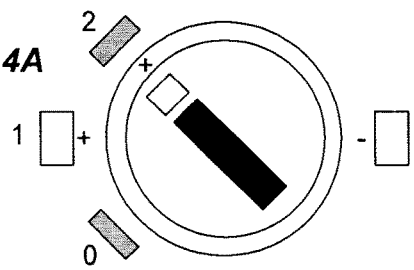
Figure 14B:
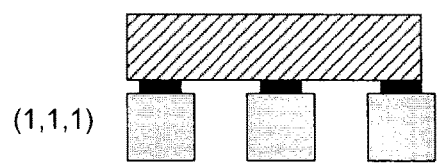
Figure 18A:
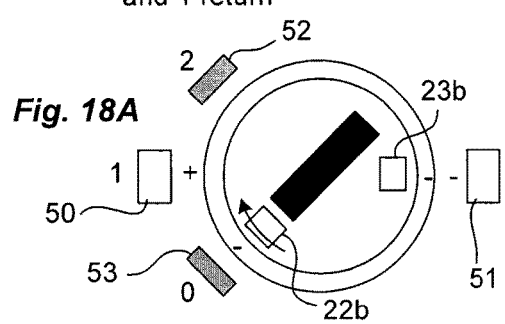
Figure 18B:
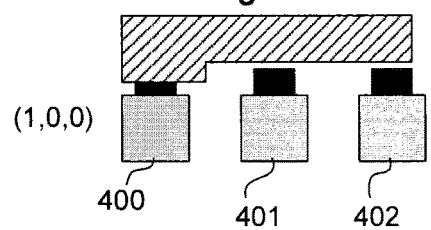
Figure 19A:
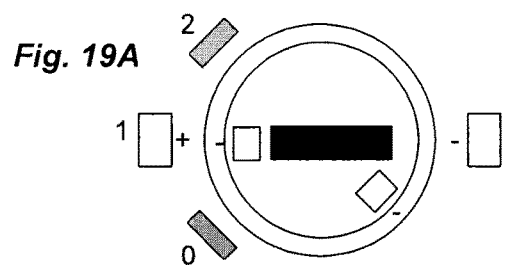
Figure 19B:
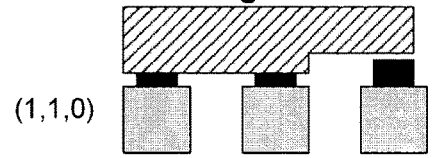
Figure 20A:
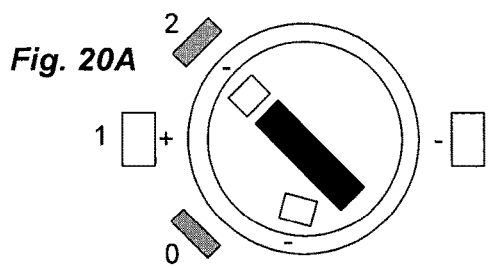
Figure 20B:
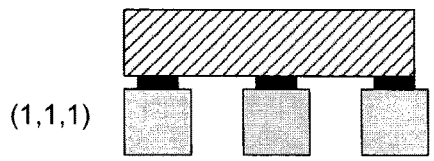
Figure 21A:
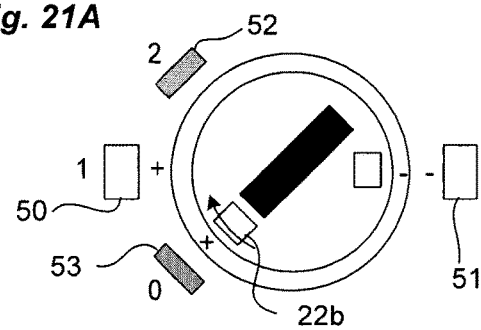
Figure 21B:
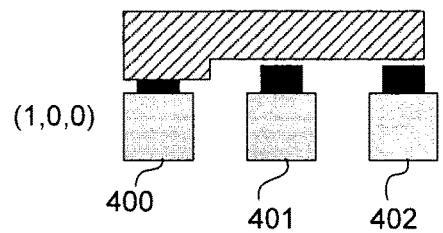
Figure 22A:
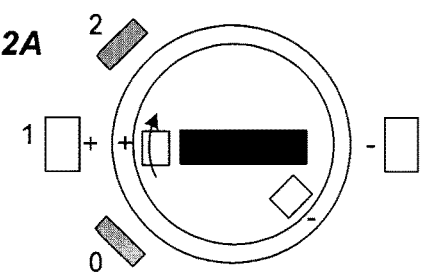
Figure 23A:
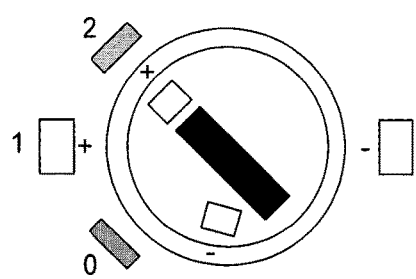
Figure 23B:
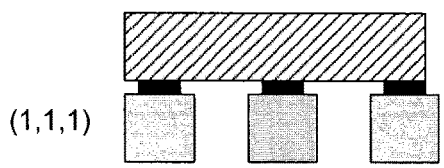

With reference to FIGS. 12A to 14B, a modular unit 2b provided with a control interface of rotary button type with two fixed positions, comprises a permanent magnet 22b. Its permanent magnet 22b is arranged to face the first magnet 50 of the universal actuation device 5 with an identical polarity so as to force the rotation of the selector to a position in which its magnet 22b faces one or the other of the metal plates of the universal actuation device. In FIGS. 12A and 12B, the rotary button is in the first position (designated 0). A single sensor unit 400 is activated (state (1,0,0)). In FIG. 13A, the rotary button is driven automatically (after a point dead centre is reached) to its second position (designated 2). In FIGS. 14A and 14B, the rotary button is in its second fixed position (designated 2). The three sensor units 400, 401, 402 are activated (state (1,1,1)).

With reference to FIGS. 15A to 17B, a modular unit 2b provided with a control interface of rotary button type with two fixed positions and one transient position is produced by assigning it two permanent magnets 22b, 23b positioned in its collar. The first position (designated 0) is obtained when its main permanent magnet 22b is situated facing a metal plate 53 and its second position (designated 1) is obtained when its main permanent magnet 22b is situated facing the first permanent magnet 50.

In the second position (designated 1) of the selector, the main magnet 22b is arranged to face the first magnet of the universal human-machine dialogue device with a reversed polarity so as to be able to mark the position. Its secondary magnet 23b is arranged to face the second magnet 51 of the universal actuation device 5 with an identical polarity so as to generate a magnetic repulsion effect between these two magnets. Upon a rotation to the third position, its secondary magnet 23b is once again facing the second magnet 51 of the universal actuation device 5. The magnetic repulsion effect generated between the two magnets forces the selector to return to the second position (designated 1). In FIGS. 15A and 15B, the rotary button is in the first position (designated 0). A single sensor unit 400 is activated (state (1,0,0)). In FIGS. 16A and 16B, the rotary button is in the second position (designated 1). Two sensor units 400, 401 are activated (state (1,1,0)). In FIGS. 17A and 17B, the rotary button is in the transient third position (designated 2). The three sensor units 400, 401, 402 are activated (state (1,1,1)) temporarily. By releasing the button, the latter returns automatically to its second position. A variant embodiment, represented in FIGS. 18A to 20B, consists in moving the secondary magnet 23b in relation to the main magnet 22b so as to render the first position transient and the other two positions fixed. The principle remains the same. In another variant embodiment represented in FIGS. 21A to 23B, by reversing the polarity of the main magnet 22b, the second position (designated 1) is no longer marked and the selector then becomes a selector with two positions, a fixed position (designated 2) and a transient position (designated 0).

According to the invention, the modular units 2 are positioned in the housing 3 removably and interchangeably. The modular units 2 can easily be swapped over in the system or can each be easily replaced in the event of failure or in the event of a control change.

According to the invention, each universal human-machine dialogue assembly 4 incorporated in the support is coupled to a central control unit 6 (FIG. 1) by a point-to-point link or by a multipoint link. The central control unit 6 ensures the power supply and the transfer of data to each universal human-machine dialogue assembly 4. The central control unit will be able to be incorporated in the system or produced in a separate device. The central unit can therefore send a control command, individually, to each display unit 41 of a universal human-machine dialogue assembly 4 and receive a control signal from each sensor unit 400, 401, 402 of the universal human-machine dialogue assemblies 4 which are connected to it.

In point-to-point link mode, each universal human-machine dialogue assembly 4 is therefore connected independently to the central control unit 6. The housing therefore incorporates a ribbon cable connected to the central control unit 6. In this configuration, parameters must be set for the central control unit in order to be informed of the type of modular unit placed facing each docking station.

In multipoint link mode, the universal human-machine dialogue assemblies 4 are connected to the central control unit 6 via a communication and power supply bus arranged inside the support 3, for example on the electronic board 35 supporting the universal human-machine dialogue assemblies 4. A communication protocol is therefore necessary to ensure the communication between the central control unit 6 and the universal human-machine dialogue assemblies 4. In multipoint mode, each control signal sent by the central control unit 6 or received by the latter must include the identifier of the receiving or sending universal human-machine dialogue assembly 4. The communication protocol is, for example, a two-wire protocol making it possible to convey both the power supply to the universal human-machine dialogue devices 4 and the communication frames exchanged between each universal human-machine dialogue assembly 4 and the central control unit 6. A protocol of this type that is already known is the one called "one wire" (also called DALLAS protocol) described at the following address:

http://daniel.menesplier.free.fr/Doc/BUS%201%20WIRE.pdf

In a communication bus architecture, a learning step will be necessary in order to inform the central control unit 6 of the type of modular unit 2 present in each docking station, in such a way that the central control unit 6 ensures a control matched to the universal human-machine dialogue assemblies 4.

According to the invention, the central control unit 6 may be incorporated in the support 3, partially or totally remote from said support. In FIG. 1, the central control unit 6 is represented as remote from the housing 3 and linked to the universal human-machine dialogue devices 4 via a cable 60 ensuring the power supply and the transfer of data. In FIG. 1, the cable 60 passes through the wall P and connects two terminals provided inside the housing 3.

Advantageously, the human-machine dialogue system will be adapted to implement the emergency stop function. For this, the housing 3 will incorporate a sensor unit capable of producing this function, this sensor unit being linked to the central control unit 6 by a secured link. The sensor unit will be able to be associated with the determined docking station, intended to receive a specific unit having a control interface of emergency stop type 7 (FIG. 2). As a variant embodiment, this specific unit will be able to be incorporated in the housing, associated with its sensor unit.

Advantageously, the learning step mentioned above will be able to performed upon the first actuation of the control interface of a modular unit 2a, 2b or upon its installation (modular unit 2c). A learning software module run in the central control unit 6 makes it possible to detect whether it is a control interface of rotary button type or of pushbutton type, or a display interface only, for example by taking account of the state of the sensor units of each docking station.

In practice, if the central control unit 6 receives from one sensor device 40, in succession, during a determined learning period, two states out of (1,0,0), (1,1,0) and (1,1,1), the software module determines that the modular unit present in that docking station is one with control interface of rotary button type. These states are, for example, represented in FIGS. 9B, 10B and 11B.

If the central control unit 6 receives from a sensor device 40 the state (0,0,0) and the state (1,1,1), the software module determines that the modular unit present in this docking station is one with control interface of pushbutton type.

If, during the determined learning period, the central control unit 6 receives only one state out of (1,0,0); (1,1,0); (1,1,1); (0,1,0); (0,1,1); (0,0,1); (1,0,1), it produces therefrom that the docking station is occupied by a modular unit 2c with display interface. This particular feature allows for a local configuration, without employing an external programming unit.

Moreover, the colour of the display interface can also be coded by the state of the sensor units. Depending on the sensor units actuated by the actuation tab 24a, 24c, upon installation and/or actuation of the modular unit, the central control unit 6 determines, by an appropriate software module, the colour of its display interface. This is valid for a modular unit with display interface only or with control interface and display interface. It is thus possible to associate a distinct colour with each of the following combinations of states: (1,0,0); (1,1,0); (1,1,1); (0,1,0); (0,1,1); (0,0,1); (1,0,1). Depending on the combination received by the central control unit 6, during the determined learning period, the software module determines the colour returned by the display interface. These principles are detailed below in conjunction with the appended figures.

Figure 24A:
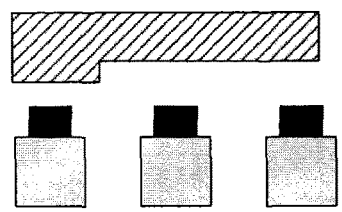
FIGS. 24A to 26B illustrate the principle of coding of the colour of a human-machine dialogue device with control interface of pushbutton type and with display interface, respectively for three distinct colours.
Figure 25A:
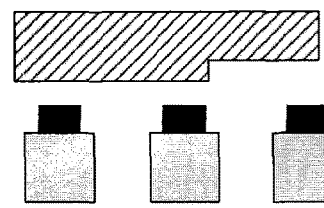
Figure 26A:
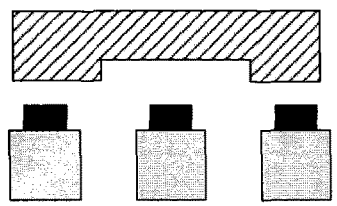
Figure 24B:
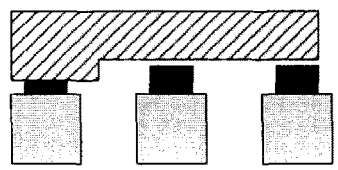
Figure 25B:
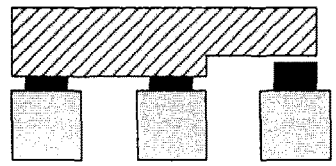
Figure 26B:
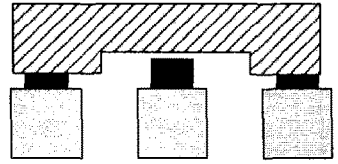

For a human-machine dialogue device with control interface of pushbutton type and with display interface, its interface type is determined, in the learning step, by the initial state (0,0,0) of the control interface (see above). The actuation of the control interface results in the switching of one or two sensor units by the actuation tab 24a and the central control unit 6 associates a determined colour with the state generated ((1,0,0), (1,1,0) or (1,0,1)). This is illustrated in FIGS. 24A and 24B to code a first colour, in FIGS. 25A and 25B to code a second colour and in FIGS. 26A and 26B to code a third colour.

Figure 27:
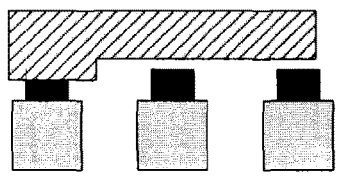
FIGS. 27 to 29 illustrate the principle of coding of the colour of a human-machine dialogue device with display interface, respectively for three distinct colours.
Figure 28:
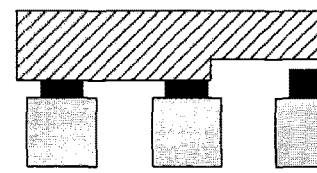
Figure 29:
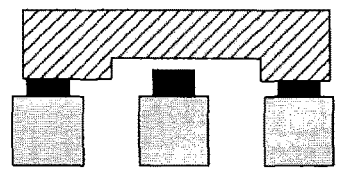

For a human-machine dialogue device having only a display interface, the principle will be the same. The snap-fitting of the modular unit into the opening 32 leads automatically to the actuation of one or two of the sensor units by the actuation tab 24c. The state (1,0,0), (1,1,0) or (1,0,1) generated enables the central control unit 6 to determine that the human-machine dialogue device is one with display interface only. Each of these states is associated by the central control unit 6 with a distinct colour. The different states are represented in FIGS. 27 to 29.

Advantageously, each modular unit 2 can incorporate an electronic tag storing an identifier and the function of the modular unit. This is, for example, a tag of RFID (Radio Frequency Identification) type. A reading station (for example incorporated in the central control unit 6) comprising an antenna incorporated in the housing 3, thus makes it possible to detect the occupied docking stations and determine the function of each modular unit 2 occupying a docking station. This architecture thus makes it possible to dispense with the learning step described above or to complete it.

According to a variant embodiment, the system may comprise a wireless communication module making it possible to exchange signals with the central control unit 6 through a wireless link. The communication will be able to be conducted for example by radio waves via known protocols of WIFI, Bluetooth, and other such types. The data exchanged notably comprise the control commands sent by each sensor unit and/or the switch-on or switch-off commands sent by the central control unit 6 to the display units. This communication module may comprise a centralized transceiver, incorporated in the housing 3 and responsible for exchanging data with the central control unit 6. It may also comprise a plurality of distinct transceivers each associated with a universal human-machine dialogue device 4.

The invention therefore consists in separating the switching and display functions, produced by the sensor device and by the display unit, the control and/or display interface. By proposing to employ universal human-machine dialogue devices including the two functions, it is thus possible to dispense with constraints on the positioning of the modular units, to easily choose its configuration and modify it. Moreover, by incorporating a universal actuation device, each modular unit is further lightened, which makes it possible to improve its reliability and reduce its cost.

The human-machine dialogue system 1 of the invention therefore presents the following advantages:

it enables an operator to choose or adapt its configuration, according to the application controlled, it makes it possible to easily replace one modular unit with another, it is easy to install, in that it requires only two fixing holes for the support and one hole for the cable entry, it makes it possible to propose modular units with a moderate cost, the latter embedding no electronic board and including standard ingress protection, the electronic board being housed inside the housing, it is easy to ensure its insulation from the outside and guarantee a good ingress protection level, it is not bulky, it makes it possible to employ modular units including a minimum of mechanical parts, resulting in simple and reliable operation, the functions borne only by mechanical parts, the positions of the control interfaces are retained, even in the event of electrical power supply outage.

The invention claimed is:

1. A device, comprising:
a housing containing a docking station having:
a universal human-machine dialogue assembly, the universal human-machine dialogue assembly including at least one display and at least one sensor device to interact with a user, and
a universal actuation device configured to interface human interfaces with the at least one sensor device, the human interfaces including:
a display interface configured to be removably installed in the docking station via a snap fit and to cooperate with the at least one display of the universal human-machine dialogue assembly to provide colored display information generated by the at least one display,
a pushbutton-type control interface configured to be removably installed in the docking station via a snap fit and to cooperate with said at least one sensor device to generate at least one control signal and an actuation system configured to cooperate with the universal actuation device to establish a rest position and at least actuated position on the control interface, and
a rotary button-type control interface configured to be removably installed in the docking station via a snap fit and to cooperate with said at least one sensor device to generate at least one control signal and having an actuation system configured to cooperate with the universal actuation device in order to establish a plurality of fixed positions, transient positions, or both, on the control interface,
wherein the at least one sensor device includes at least three sensors mounted in an arc on an electronic board to provide actuation switching for the at least one human interface,
each of the display interface, the pushbutton-type control interface and the rotary button-type control interface being configured to be individually removed and replaced with a different human interface,
the universal actuation device includes a first permanent magnet and a second permanent magnet situated diametrically opposite the first permanent magnet, the first and second permanent magnets interacting with permanent magnets in one of the display interface, the pushbutton-type interface, or the rotary button-type interface in order to provide a corresponding actuation functionality for the one of the display interface, the pushbutton-type interface, or the rotary button-type interface, and
each of the display interface, the pushbutton-type interface and the rotary button-type interface includes a different number of permanent magnets according to a function thereof.

2. The device according to claim 1, wherein the universal actuation device includes two metal plates located on either side of the first permanent magnet.

3. The device according to claim 2, wherein the actuation system of the pushbutton-type control interface includes two permanent magnets, each configured to cooperate with the first permanent magnet and the second permanent magnet of the universal actuation device.

4. The device according to claim 2, wherein the actuation system of the rotary button-type control interface includes at least one first permanent magnet configured to cooperate by magnet effect with the first permanent magnet or with the two metal plates to mark fixed or transient distinct angular positions.

5. The device according to claim 4, wherein the actuation system of the rotary button-type control interface includes a second permanent magnet configured to cooperate by magnetic effect with the second permanent magnet to generate a rotational return function on the control interface.

6. The device according to claim 1, wherein at least one of the pushbutton-type control interface and the rotary button-type control interface includes a display interface configured to cooperate with the display of the docking station.

7. The device according to claim 1, wherein the display interface includes a colored transparent or translucent plate configured to cooperate with the display to return said colored display information.

8. The device according to claim 1, wherein each sensor includes a mechanically actuated switch.

9. The device according to claim 8, wherein the rotary button-type control interface and the pushbutton-type control interface each comprise at least one actuation tab configured to cooperate with each mechanically actuated switch to confer a state thereof.

10. The device according to claim 9, wherein the actuation tab is configured to cooperate with one or more of said three sensors to code the control interface and display interface type.

11. The device according to claim 1, wherein the first display interface includes an actuation tab configured to cooperate with one or more of said three sensors to code said colored display information.

12. The device according to claim 1, wherein the housing includes two orifices on a wall to each receive a fastening screw.

13. A system, comprising:
   at least one device of claim 1,
   a central controller and a cable linking said central controller to the universal human-machine dialogue assembly, said central controller being configured to power each universal human-machine dialogue assembly and exchange signals with the universal human-machine dialogue assembly.

14. The system according to claim 13, wherein the central controller is further configured to run learning software to determine a type of the at least one human interface positioned on the docking station.

15. The system according to claim 14, wherein the central controller, when executing the learning software, is further configured to determine a type of the at least one human interface based on one or more states assumed by the sensor device.

16. The system according to claim 13, wherein a plurality of universal human-machine dialogue assemblies are connected to the central controller by a multipoint link via a communication and power supply bus.

17. The system according to claim 13, wherein a plurality of universal human-machine dialogue assemblies are connected to the central controller by a point-to-point link.

18. The system according to claim 13, wherein each human interface includes an electronic tag storing a corresponding control interface type, display interface type, or both.

19. The system according to claim 18, further comprising:
   reader configured to read electronic tags incorporated in each human interface, said reader including an antenna arranged inside the housing.

20. The system according to claim 13, further comprising:
   a wireless interface configured to exchange data with the central controller via a wireless link.

21. The system according to claim 13, further comprising:
   a plurality of identical docking stations arranged contiguously inside the housing, each docking station being configured to receive a human interface.

* * * * *